(12) United States Patent
Yamamoto et al.

(10) Patent No.: US 6,283,780 B1
(45) Date of Patent: Sep. 4, 2001

(54) TEST SOCKET LATTICE

(75) Inventors: Isamu Yamamoto, Takarazuka; Tomohiro Nakano, Fujisawa; Akira Kaneshige, Musashino, all of (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/445,034

(22) PCT Filed: Mar. 31, 1999

(86) PCT No.: PCT/US99/07078

§ 371 Date: May 3, 2000

§ 102(e) Date: May 3, 2000

(87) PCT Pub. No.: WO99/50676

PCT Pub. Date: Oct. 7, 1999

(30) Foreign Application Priority Data

Apr. 1, 1998 (JP) .................................................. 10-105894

(51) Int. Cl.[7] .................................................. H01R 33/02
(52) U.S. Cl. ........................................ 439/266; 439/259
(58) Field of Search ............................... 439/266, 66, 71, 439/259, 263, 264, 265, 268, 330, 331

(56) References Cited

U.S. PATENT DOCUMENTS

| 5,460,538 | 10/1995 | Ikeya | 439/331 |
|---|---|---|---|
| 5,531,608 | 7/1996 | Abe | 257/697 |
| 5,646,442 | 7/1997 | Abe et al. | 439/330 |
| 5,685,725 | 11/1997 | Uratsuji | 439/71 |
| 6,036,503 | * 3/2000 | Tshucida | 439/70 |

FOREIGN PATENT DOCUMENTS

| 1534469 | 3/1996 | (DE) . |
|---|---|---|
| 0553470 | 3/1993 | (EP) . |
| WO9950677 | 10/1997 | (WO) . |

OTHER PUBLICATIONS

Patent Abstracts of Japan, vol. 97, No. 10, No. 09162332 Oct. 31, 1997.

* cited by examiner

*Primary Examiner*—Gary F. Paumen
*Assistant Examiner*—Alexander Gilman
(74) *Attorney, Agent, or Firm*—Charles S. Cohen

(57) ABSTRACT

A socket is provided for burn-in testing of an integrated circuit package having electrical leads. The socket includes a socket body having an array of columns and rows of generally rectangular terminal-receiving cavities therein, each of the generally rectangular terminal-receiving cavities having a longitudinal direction corresponding to its longer dimension and a plurality of terminals disposed in the terminal-receiving cavities for contacting the leads of the integrated circuit package. Each column and row of the array includes a sequence of at least three adjacent cavities wherein for each cavity of the sequence other than the first and last, the longitudinal direction of the cavity is substantially perpendicular to the longitudinal direction of the two cavities in the sequence adjacent the cavity on either side.

14 Claims, 11 Drawing Sheets

TEST SOCKET LATTICE

BACKGROUND OF THE INVENTION

The present invention relates generally to electrical connectors, and more particularly, to burn-in sockets suitable for the testing of integrated circuit ("IC") packages.

Conventional burn-in sockets typically include a plurality of terminals fitted in a corresponding plurality of terminal-receiving cavities. The terminals generally include a contact section for contacting leads from the IC packages, tail sections for electrically connecting to another electronic component, and resilient sections between the contact sections and tail sections for providing contact pressure to ensure a reliable electrical path through the terminal.

Most commonly, terminal-receiving cavities are rectangular and uni-directionally aligned. Although there are examples of such rectangular cavities having been aligned obliquely or being haphazardly unaligned, they are typically uniformly aligned parallel or perpendicular with respect to the sides of the socket housing.

Regardless of the alignment, however, it is generally desirable, due to the increased miniaturization of electrical components and the increased demand for higher speed and parallel pathways, to increase the density of terminals through the socket. Thus, it is an object of the invention to provide a burn-in socket which permits an increased density of terminals per unit area in the socket body while maintaining sufficient strength to withstand the cycled stresses of repeated engagement and disengagement with IC packages being tested sequentially.

An additional factor relevant to the quality of sockets designed for burn-in testing of integrated circuit packages is the efficiency with which they can test such packages. Thus, it is important to ensure that integrated circuit packages inserted into burn-in sockets are properly aligned within the socket for testing. In particular, misaligned packages may provide faulty test readings as leads from the integrated circuit packages may not have reliable electrical pathways to the electrical testing component, such as a burn-in board. Conventional burn-in testing sockets which include apparatus for lowering an integrated circuit package into contact with the terminals thereof often have less than satisfactory means for assuring lateral position of the package and, thus, may produce unsatisfactory burn-in testing results and efficiency.

Accordingly, it is an object of the present invention to provide a burn-in socket capable of permitting the residence of terminals therein at an increased density without harming the physical strength and performance of the socket. It is another object of the present invention to assure that each terminal has reliable contact with an appropriate lead of an inserted integrated circuit package to provide more efficient burn-in testing of integrated circuit packages.

SUMMARY OF THE INVENTION

To attain the aforementioned objects, a socket is provided for burn-in testing of an integrated circuit package having electrical leads. In one embodiment of the invention, the socket includes an outer socket housing and an inner socket housing slidably moveable relative to the outer housing between an upper limit position and a lower limit position, the inner housing for supporting the integrated circuit package thereon and having a plurality of terminal-receiving cavities therein. The socket further includes a plurality of terminals disposed in the terminal-receiving cavities of the inner housing for contacting the leads of the integrated circuit package, a cam mechanism for raising and lowering the inner housing between the upper limit position and lower limit position relative to the outer housing, and a latch mechanism for holding and releasing the integrated circuit package relative to the inner housing.

In another aspect, the socket of the invention includes an opening for insertion of the IC package, an outer socket housing, and an inner socket housing that is slidable relative to the outer housing between an upper limit position and a lower limit position. The inner housing has a plurality of terminal-receiving cavities therein, a plurality of terminals disposed in the terminal-receiving cavities of the inner housing, a cam mechanism having an actuator, and a latch mechanism having the same actuator as the cam mechanism. At least one of the cam mechanism and the latch mechanism includes a return biasing apparatus, and the latch mechanism includes a latch arm.

The unique lattice arrangement of terminal-receiving cavities and terminals permits increased terminal density without compromising the strength and physical performance characteristic of the test socket. Furthermore, the unique interaction of the cam mechanism and latch mechanism relative to the timing of the insertion/removal of the integrated circuit and the relative gentle and steep sloped portions of the interaction between the cam surface and cam follower surface provide a reliable socket and method for burn-in testing of integrated circuits, wherein the risk of fallen or dislocated integrated circuits is minimized.

DETAILED DESCRIPTION OF THE PREFERRED EMBODIMENT

Figure 1:
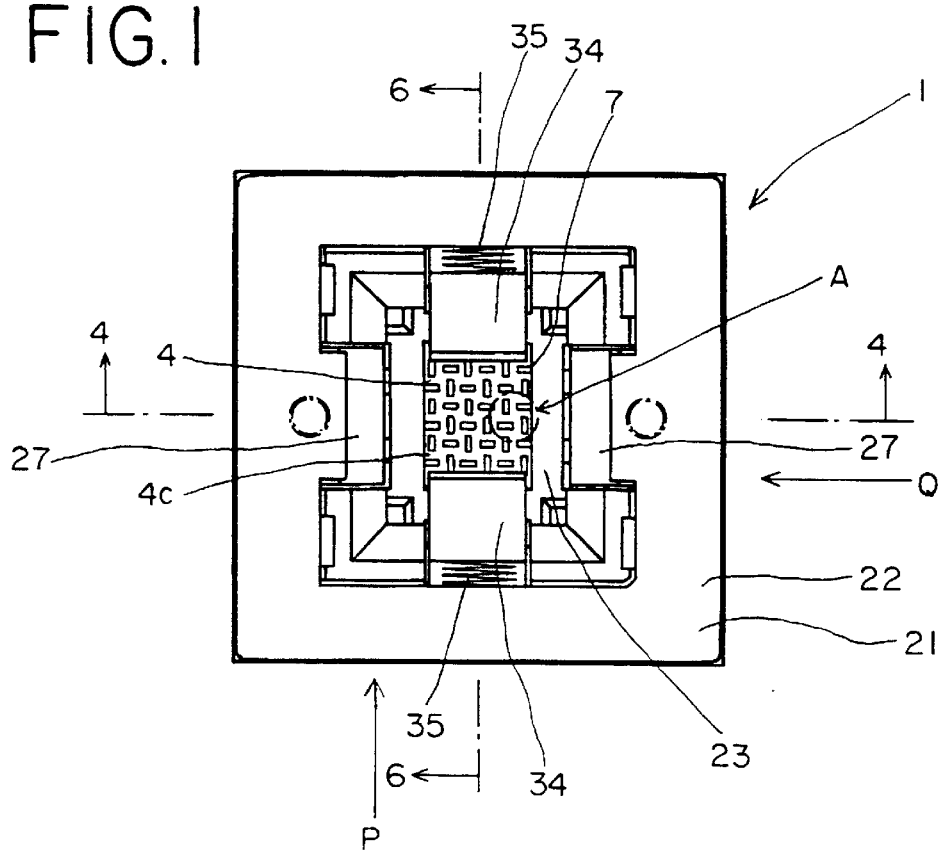
FIG. 1 is a plan view of a burn-in socket constructed in accordance with the principles of the present invention.
Figure 2:
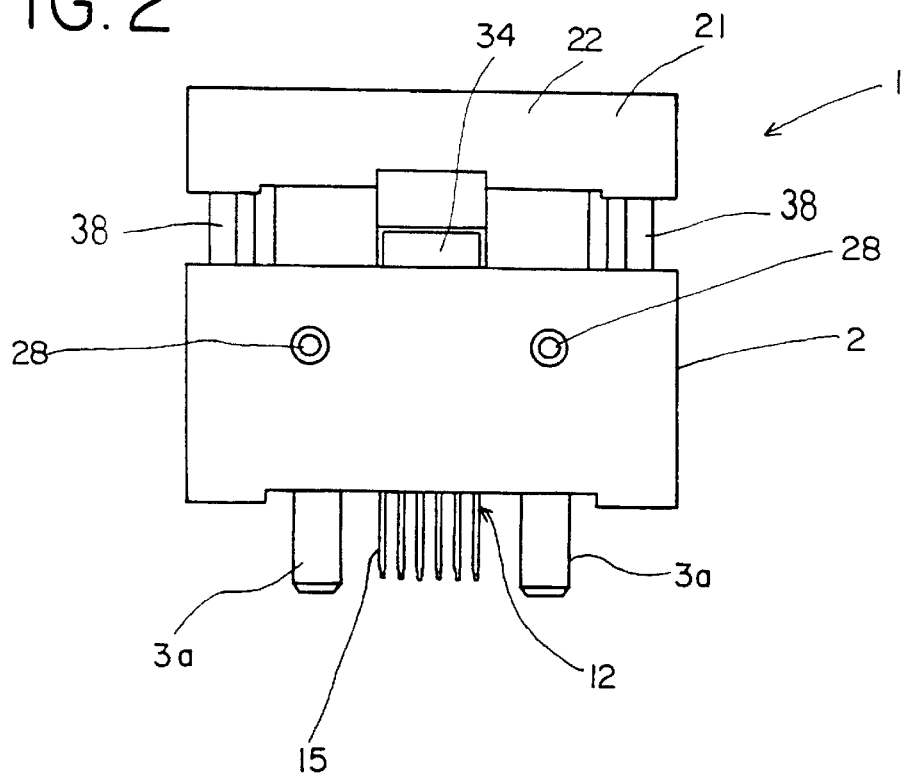
FIG. 2 is a side elevational view of the burn-in socket of FIG. 1 taken in the direction indicated by arrow P as shown in FIG. 1.
Figure 3:
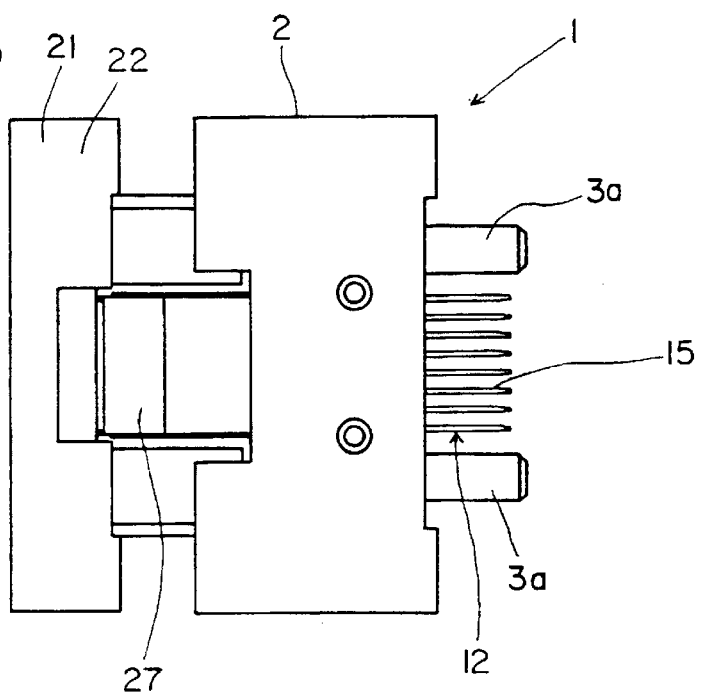
FIG. 3 is a side-elevational side view of the burn-in socket of FIG. 1 taken in from the direction indicated by arrow Q in FIG. 1.
Figure 4:
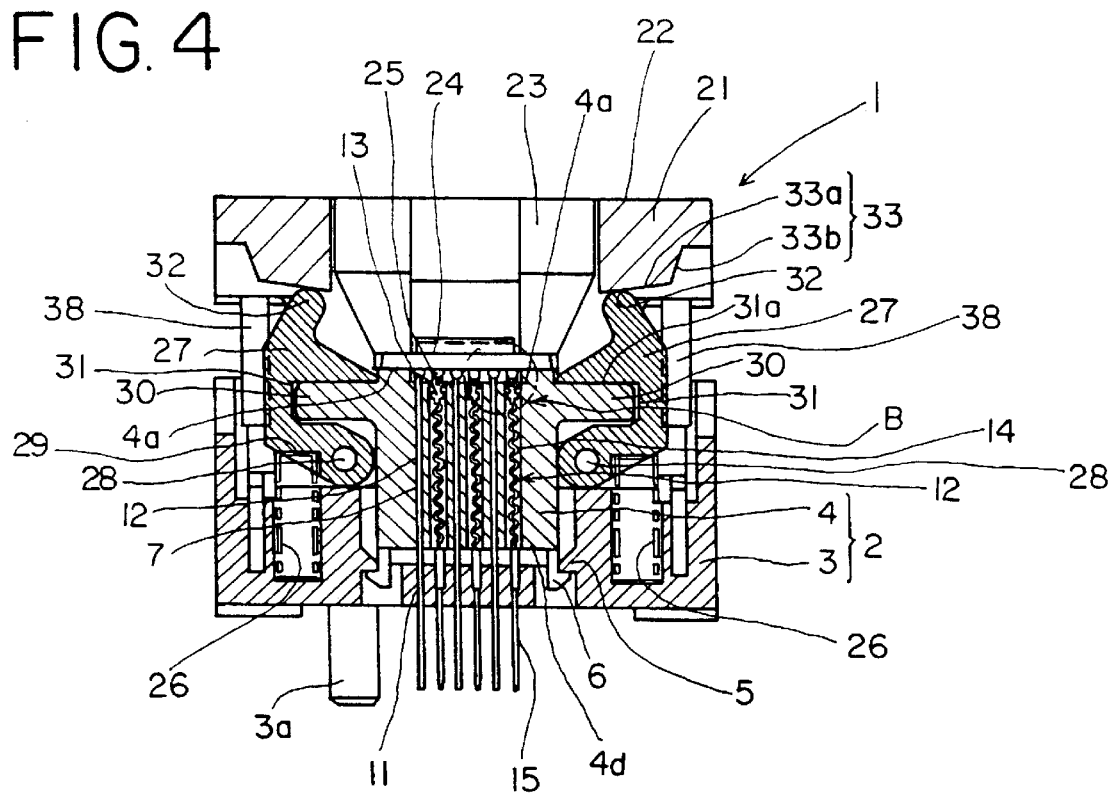
FIG. 4 is a sectional view of the burn-in socket of FIG. 1 taken along line 4—4 thereof, showing the relative disposition of the components of the burn-in socket when an IC package is subjected to a burn-in test.

Referring to FIG. 1, a burn-in socket 1 can be seen to include a socket body 2, which, in turn, includes an outer housing 3 having attached pegs 3a integrally connected to its bottom, and an inner housing 4 fitted in the outer housing 3. Specifically, the inner housing 4 is fitted in the outer housing 3 with the engagement nails 6 of the inner housing 4 coming flush with counter-engagement nails 5 of the outer housing 3 to prevent the inner housing 4 from separating from the outer housing 3 while permitting the inner housing 4 to descend into the outer housing 3.

The inner housing 4 has a recess 4b on its top 4a, and a plurality of terminal-receiving cavities 7 run from the top 4c to the bottom 4d of the inner housing 4.

Figure 11:
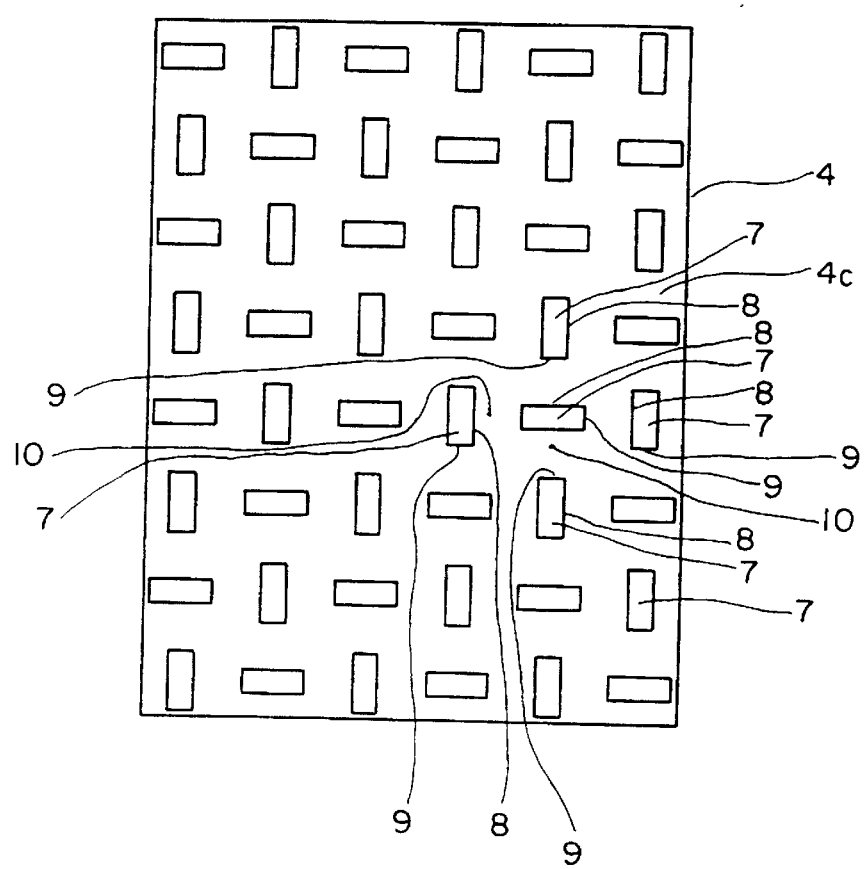
FIG. 11 is a schematic plan view representation of a lattice of terminal-receiving cavities arranged in the test socket of FIG. 1.
Figure 12:
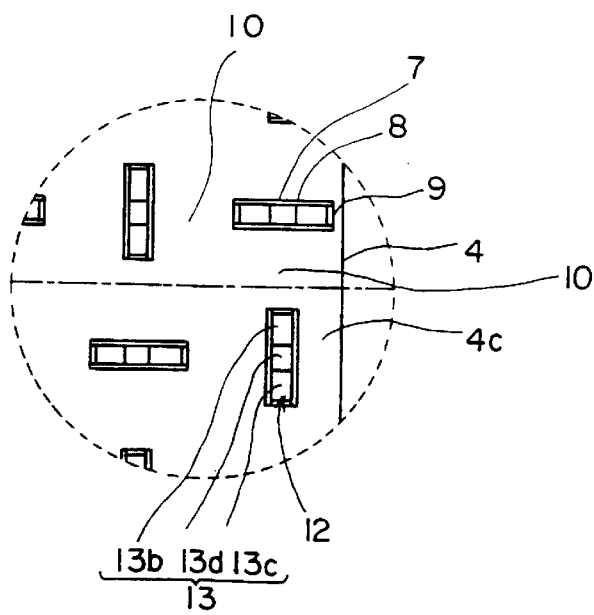
FIG. 12 is an enlarged, more detailed view of a portion of the lattice of FIG. 11 at the location indicated by arrow A in FIG. 1.

As best seen from FIGS. 11 and 12, the terminal-receiving cavities 7 are rectangular in shape and are arranged to form a lattice pattern in which each cavity 7 is arranged with its opposing long sides 8 of the rectangle confronted perpendicularly to a short side of two adjacent rectangular cavities, and with its opposing shorts sides 9 confronted perpendicularly to a long side of two adjacent rectangular cavities. This arrangement leaves an identically sized, predetermined intervening space 10 between each side of a rectangular cavity 7 and its confronting side of each of its surrounding rectangular cavities. In the particular embodiment shown, each long side 8 of the rectangular cavity 7 is approximately twice as long as each short side 9.

This lattice arrangement in the recess 4c of the inner housing 4 permits terminal-receiving cavities 7 to be arranged at an increased density while still assuring that the inner housing 4 has physical strength of the housing relatively evenly distributed thereover. In contrast, more conventionally aligned cavity arrangements tend to reduce the physical strength in a direction parallel or perpendicular to the direction of alignment. Thus, an increased number of rectangular cavities per unit area can exist without loss of strength compared with conventional arrangements of aligned cavities. The outer housing 3 has a corresponding plurality of terminal tail-receiving cavities 11 in vertical alignment with the cavities 7 of the lattice arrangement just described.

Figure 13:
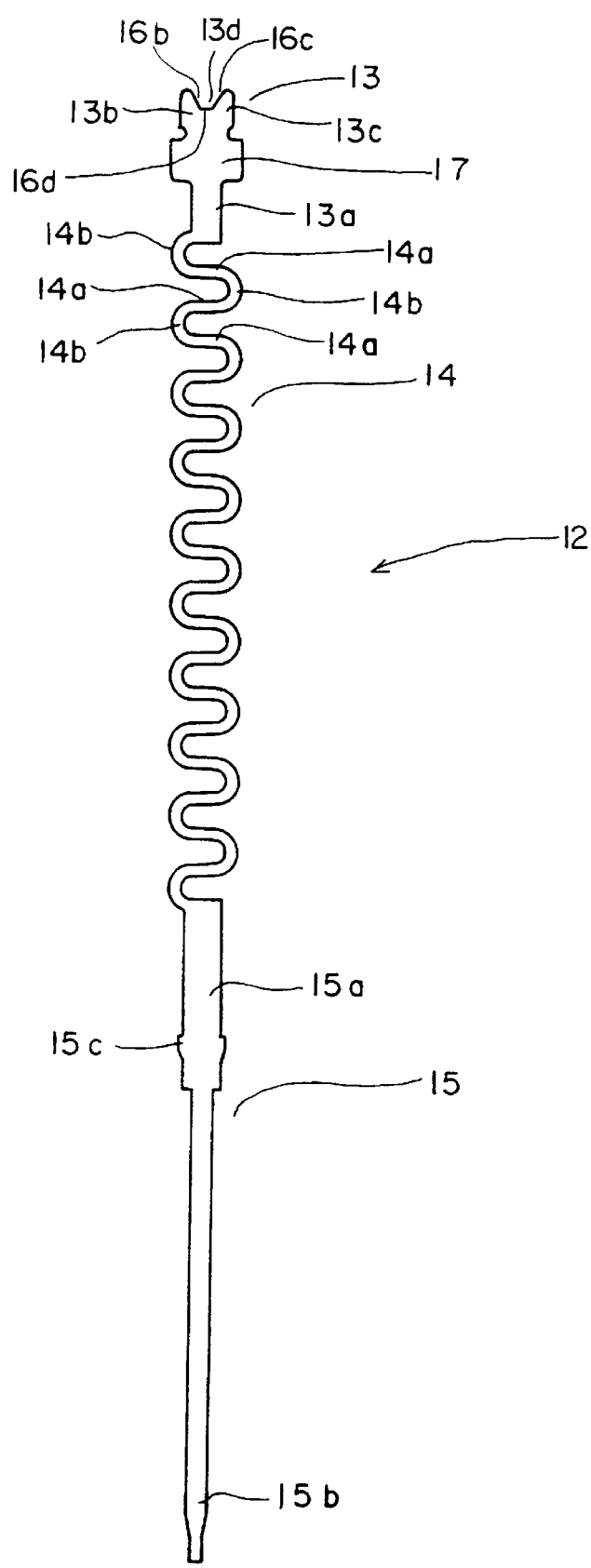
FIG. 13 is a side elevational view of a terminal constructed in accordance with the principles of the present invention.
Figure 14:
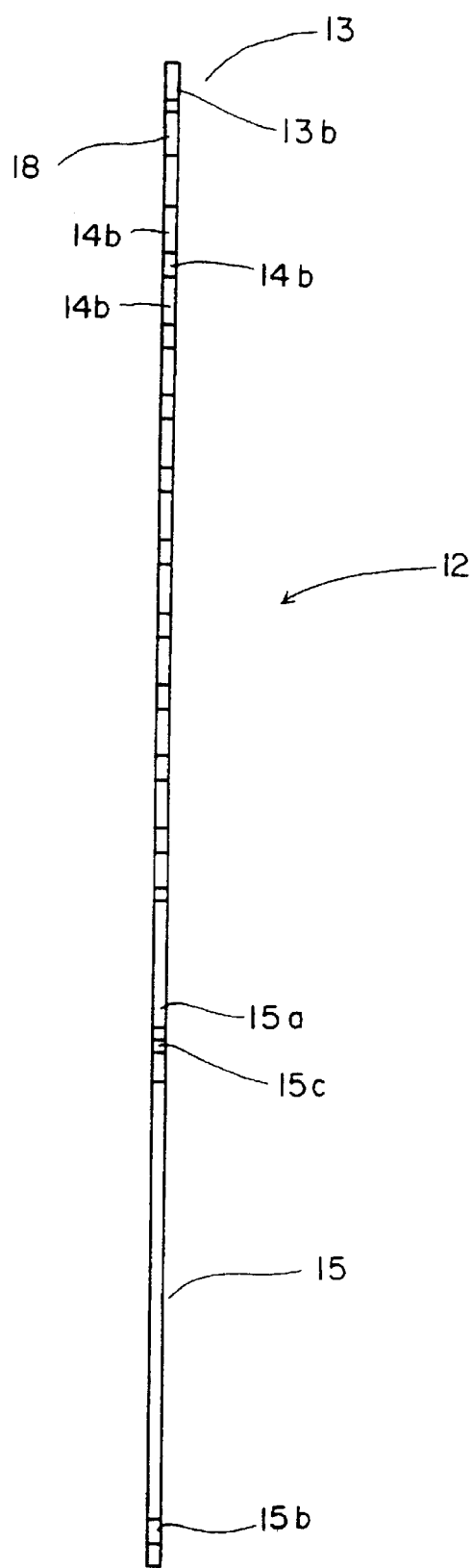
FIG. 14 is an end elevational view of the terminal of FIG. 13.
Figure 15:
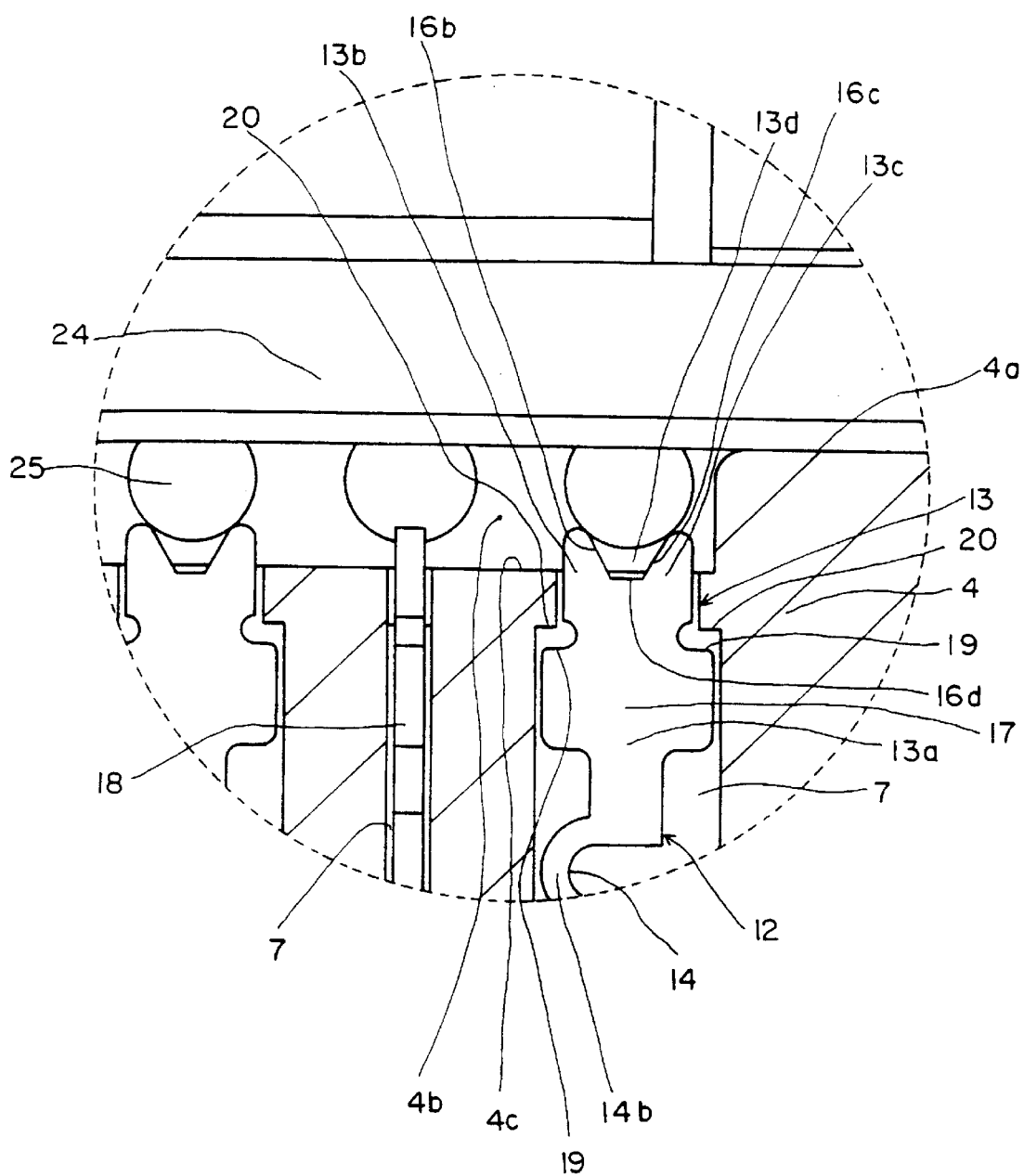
FIG. 15 is an enlarged, detailed sectional view taken at arrow B of FIG. 4 illustrating how the contact sections of selected terminals in contact with solder balls of the IC package.

Referring to FIGS. 13, 14 and 15, each terminal 12 can be seen to include a contact section 13, a resilient section 14, and a tail section 15. These sections are integrally connected with the resilient section 14 disposed between the contact section 13 and the tail section 15. The contact section 13, in one embodiment, includes a pair of contact pieces 13b and 13c integrally connected to a base plate 13a. These contact pieces 13b and 13c are symmetrically arranged to form a V-shaped contact plane defining oblique contact surfaces 16b and 16c and a narrow valley bottom 13d.

The resilient section 14 of each terminal 12, in one embodiment, includes a series of connected U-shaped pieces 14b arranged alternately in opposite directions, extending from the contact section 13 to the tail section 15. As shown in FIG. 13, the U-shaped pieces 14b may be connected to one another by linear pieces 14a. Alternatively, these linear pieces 14a can be omitted with the U-shaped pieces 14b connected directly to one another.

The tail section 15, in one embodiment, includes a base piece 15a and a tail contact 15b integrally connected to the base piece 15a. The tail contact 15b is for electrical connection to an electronic component on a burn-in board (not shown). The base piece 15a, in this embodiment, has engagement nails 15c formed on its opposite sides.

The terminal 12 is relatively wide in the plane in which the resilient section 14 runs in the serpentine pattern shown from the contact section 13 to the tail section 15, and relatively narrow in the plane perpendicular to the plane in which the resilient section 14 extends in its serpentine pattern. The terminal 12 may be a piece of metal sheet stamped with a punch directed perpendicularly to the relatively wide side 17. The precise serpentine shape can be stamped out of a piece of thin metal sheet. It may also be possible to form such a terminal 12 by first stamping the resilient section 14 and then bending it alternately in opposite directions to form a series of U-shaped pieces as shown in FIG. 13.

In order to insert the terminal 12 in a selected terminal-receiving cavity 7 in the inner housing 4 and a corresponding tail-receiving cavity 11 in the outer housing 3, the terminal 12 is aligned with the selected terminal-receiving cavity 7 with its wide and narrow sides, 17 and 18, respectively, parallel to the long and short sides, 8 and 9, respectively, of the rectangular cavity 7. Then the contact section 13 of the terminal 12 is inserted into the rectangular cavity 7 from the bottom of the inner housing 4 until the contact section 13 appears in the recess 4b, thereby allowing opposite shoulders 19 of the base piece 13a of the contact section 13 to abut on opposing stopper projections 20 formed in the open end of the selected terminal-receiving cavity 7. After all such terminal-receiving cavities 7 of the inner housing 4 are filled with terminals 12, the inner housing 4 is fitted into the outer housing 3, thereby allowing the base pieces 15a of the tail sections 15 of the terminals 12 to enter the tail-receiving cavities 11 of the outer housing 3. The opposing engagement nails 15c of the base piece 15a of each terminal 12 are brought into engagement with the wall of the tail-receiving cavity 11 by pulling the tail sections 15 protruding from the bottom of the socket body 2. In this manner, every terminal 12 can be positively held in the socket body 2.

When the terminals 12 are mounted in the inner and outer housings 4 and 3, each terminal is surrounded by (or centered among) four adjacent terminals which are rotated 90° relative to it. Thus, wide and narrow sides of the base pieces 17 of the contact sections 13 appear alternately in columns or rows of the inner housing 4. (See FIGS. 11, 12 and 15).

Preferably, the serpentine resilient section 14 and its component U-shaped pieces 14b are sized relatively to the rectangular cavity 7 such that the terminal 12 may be compressed without the pieces 14b touching the surrounding wall of the rectangular cavity when the contact section 13 of the terminal 12 is put in contact with a solder ball from an IC package.

The burn-in socket preferably has an annular top cover 21 with an opening 23 surrounded by a square frame 22. Thus, the burn-in socket is open on top, allowing an automatic loading-retrieving device to insert IC packages 24 substantially onto the inner housing 4 of the burn-in socket and remove the IC packages after testing.

Figure 5:
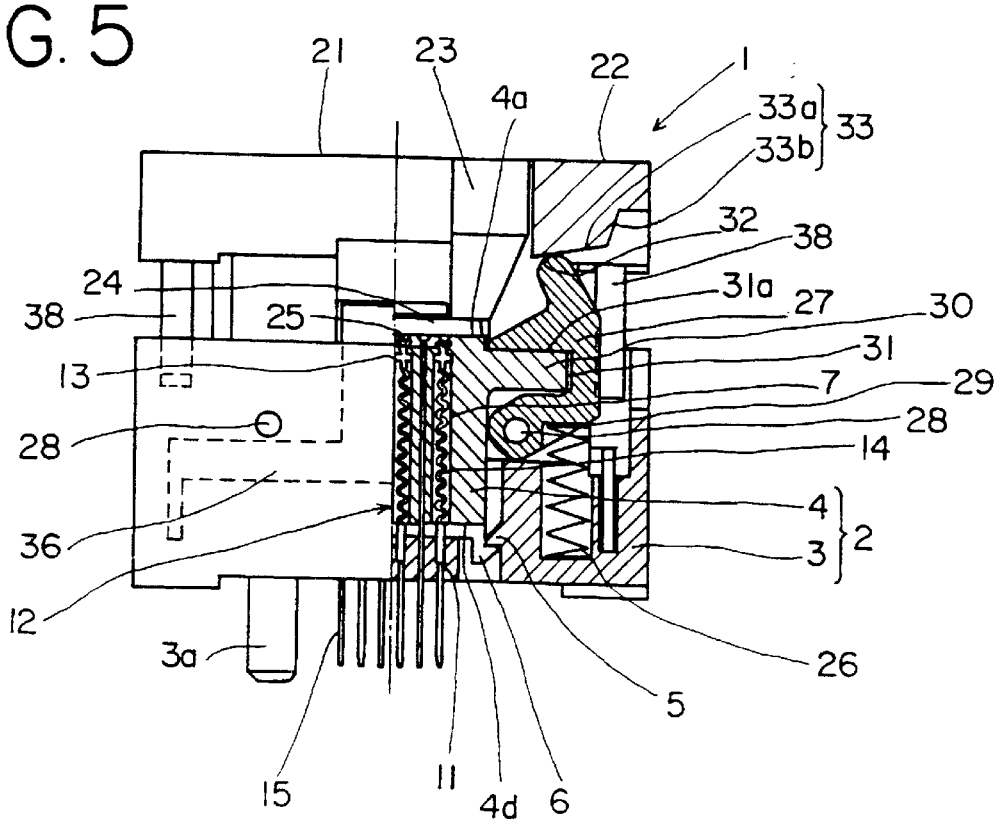
FIG. 5 is a partial sectional view, similar to that of FIG. 4, showing other components of the burn-in socket when an IC package is in place therein.
Figure 7:
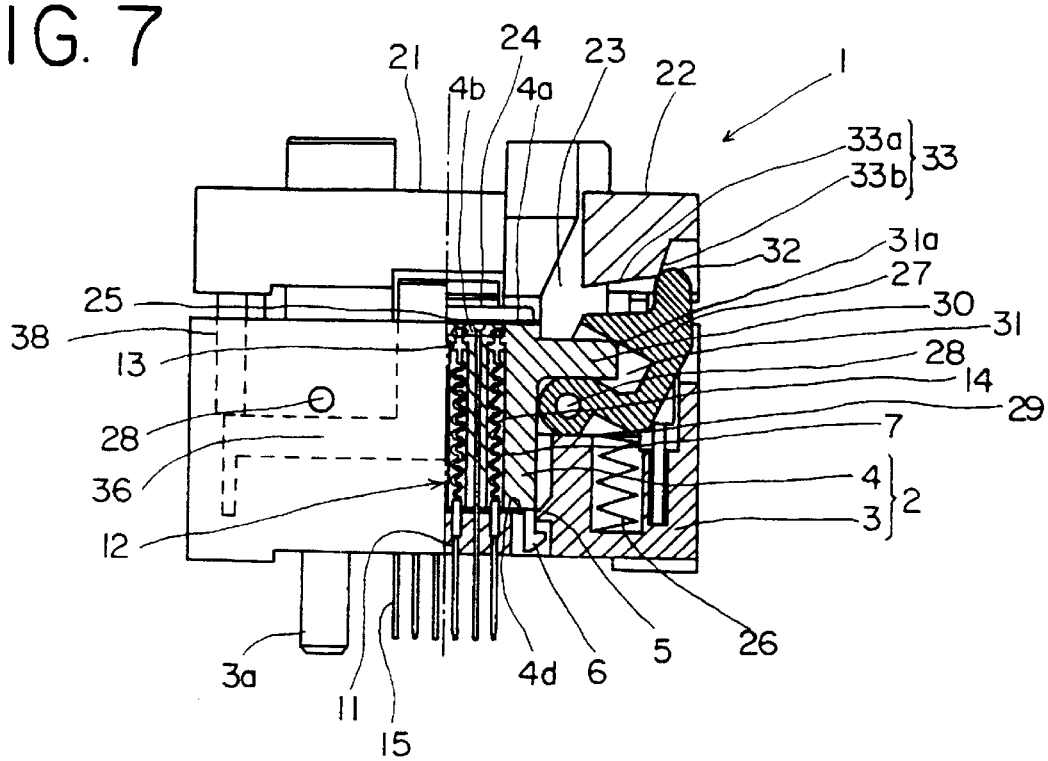
FIG. 7 is a partial sectional view of the burn-in socket of FIG. 1 taken along line 4—4 thereof, showing components of the socket when the socket is in an intermediate state prior to full insertion of the IC package therein.
Figure 9:
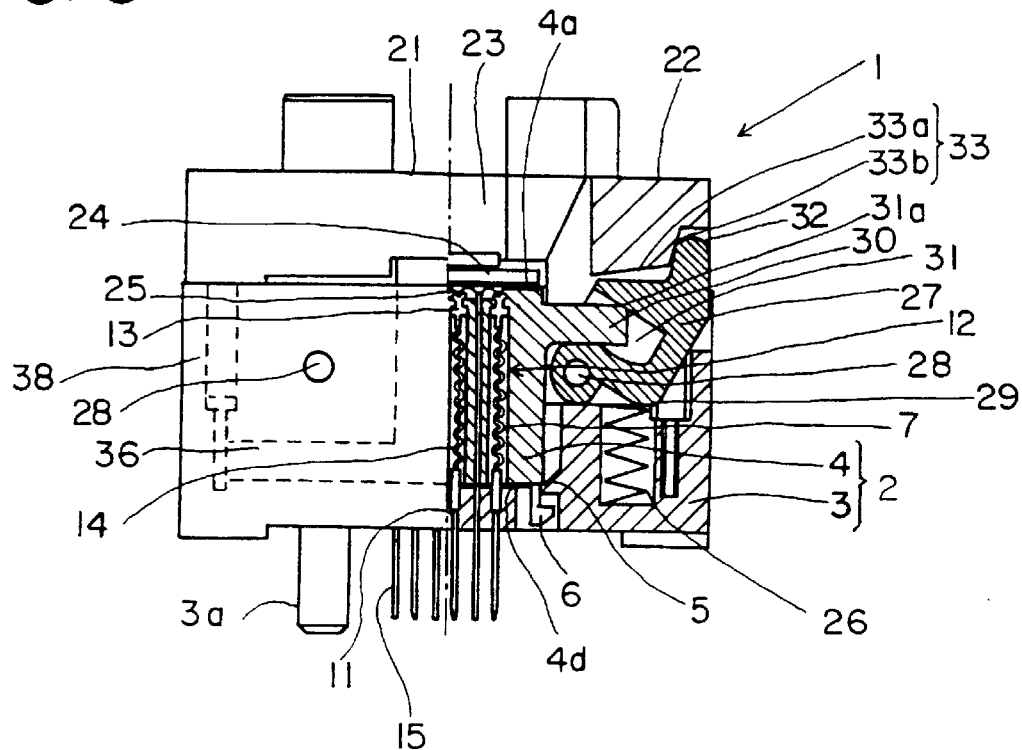
FIG. 9 is a partial sectional view of the burn-in socket of FIG. 1, taken along line 4—4 thereof, showing specific components of the burn-in socket in place when either the IC package has been released after a test or when the IC package is initially placed into the burn-in socket.

The top cover 21 is moveable up and down relative to the outer housing and the socket body 2 further includes a cam mechanism preferably having a pair of cams 27 pivotally fixed to the outer housing 3, cam return springs 26 associated with the cams 27 to bias them into an upright position, and cam follower surfaces 33 formed on a lower surface of the top cover 21. With such a structure, when the top cover 21 is released by removing an externally applied pushing-down force, the top cover 21 and the inner housing 4 are allowed to rise up to an upper limit position as shown in FIG. 5. Conversely, when the top cover 21 is pushed down by an external force, the top cover 21 and the inner housing 4 are lowered to a lower limit position as shown in FIG. 9. An intermediate, or transition, position of these components relative to each other is shown in FIG. 7.

Each cam return spring 26 is, in the illustrated embodiment, disposed between the bottom of the outer housing 3 and a spring seat 29 corresponding to the cam 27, thereby compressibly forcing the cam 27 to rotate about its pivot to the upright position when no external force acts against this motion. The cam 27 has a cam surface 32 formed on its top for slidably engaging cam follower surface 33 of the annular top cover 22. In the illustrated embodiment, the cam follower surface 33 includes a gentle slope portion 33a and a steep slope portion 33b. In the upper limit position, as shown in FIG. 5, the cam surface 32 of each cam 27 rides on the gentle slope portion 33a of the cam follower surface 33. The lowering of the top cover 21 (as by a downward external force) causes the cam surface 32 of each cam 27 to move on the gentle slope 33a, thereby tilting the cam 27 as seen in FIG. 7. Further lowering of the top cover 21 will cause the cam surface 32 to move from the gentle slope portion 33a to the steep slope portion 33b, thereby tilting the cam 27 further outward toward its lower limit position as seen in FIG. 9. The subsequent removable of the force applied to push down the top cover 21 permits each cam 27 to return to its upper limit position as shown in FIG. 5, via the transitional position shown in FIG. 7, due to the biasing influence of the return spring 26.

The rotation of cam 37 corresponds not only to up-and-down movement of the top cover 21, but also to up-and-down movement of the inner housing 4. The inner housing 4 has a pair of lateral projections 30 formed on its opposite sides, and these lateral projections are adapted to fit loosely in the lateral recesses 31 of the confronting cams 27. When the cams 27 are upright (the upper limit position—see FIG. 5) without any external downward force applied to them, the lateral projections 30 are fit in the lateral recesses 31 of the confronting cams 27 and the engagement nails 6 of the inner housing 4 are caught by the counter-engagement nails 5 of the outer housing 3. This is referred to as the "Cover-Returning, Upper Limit Position". Prior to the next burn-in test, the top cover 21 is pushed down to force each cam 27 to incline outwardly, thereby allowing the cam surface 32 of each cam 27 to make the gentle-to-steep slope transition and allow each lateral projection 30 of the inner housing 4 to begin leaving the lateral recess 31 of the cam 27. Thus, the lateral projection 30 of the inner housing 4 and, necessarily, the inner housing 4 itself, are lowered into the transitional or intermediate position shown in FIG. 7. This position is the referred to as "Cover-Descending, Intermediate Position".

Subsequently, the top cover 21 is lowered to the lower limit position as the cam surface 32 of each cam 27 rides the steep slope portion 33b until the cam 27 is in a completely tilted position. Accordingly, the inner housing 4 is lowered to its lowest position. (See FIG. 9.) This position is the "Cover-Descending, Lower Limit Position". The cam 27, the cover 21, and the inner housing 4 are configured and sized so as to cooperate as described above.

Figure 8:
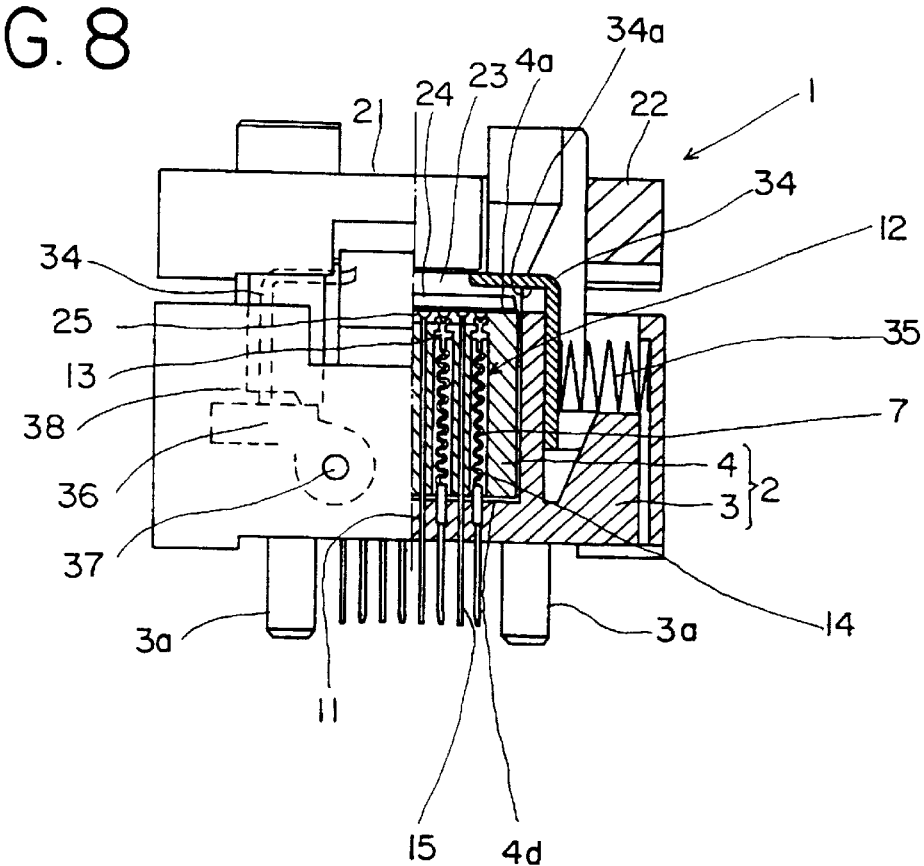
FIG. 8 is a partial sectional view of the burn-in socket of FIG. 1, taken along line 6—6 thereof, showing how often components of the burn-in socket are disposed when the burn-in socket is in the same state as shown in FIG. 7.
Figure 10:
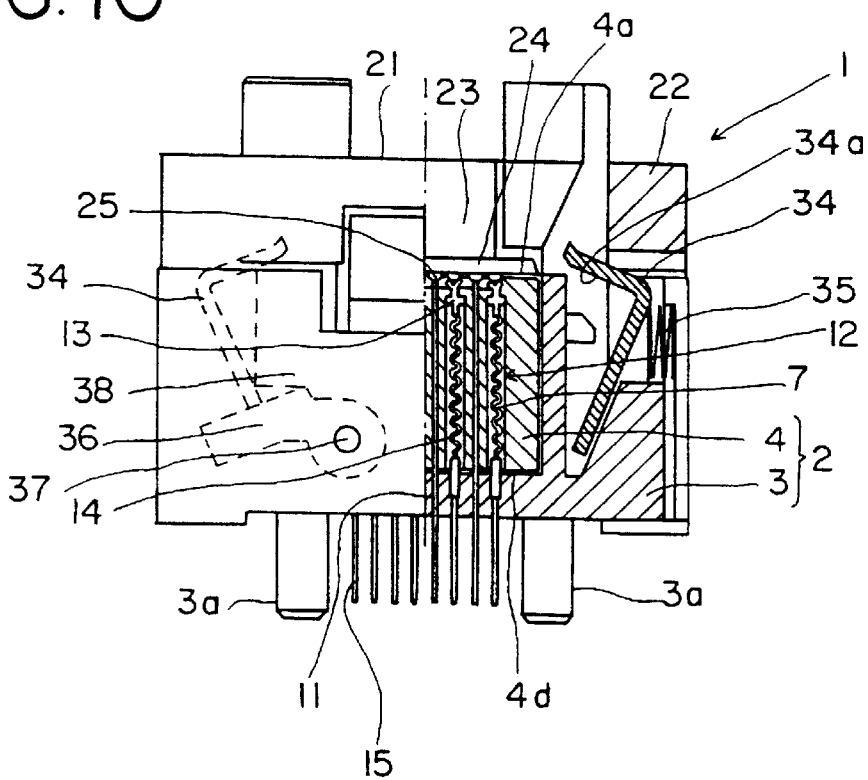
FIG. 10 is a partial sectional view of the burn-in socket of FIG. 1, taken along line 6—6 thereof, showing there components of the burn-in socket in the same state as in FIG. 9.

In the "Cover-Returning, Upper Limit Position" (FIGS. 5 and 6), IC packages 24 can be subjected to a burn-in test referred to as ("Burn-In Test Affecting Time"). In the "Cover-Descending, Intermediate Position" (FIGS. 7 and 8), the burn-in test is completed and the IC packages 24 are either about to be removed from the socket or about to have a burn-in test conducted ("transition time"). In the "Cover-Descending, Lower Limit Position" (FIGS. 9 and 10), the burn-in test is completed and the IC package can be removed from the burn-in socket 1 through the center opening 23 of the top cover 21 or the IC package 24 to be tested can be placed substantially on the inner housing 4 through the center opening 23 of the cover 21 for a burn-in test ("Releasing or Loading Time").

During the "Burn-In Test Affecting Time" (FIGS. 5 and 6), the IC package 24 must be positively held. For this purpose, the burn-in socket has a latching mechanism placed below the top cover 21. In the illustrated embodiment, the latching mechanism includes a pair of L-shaped latch arms 34 pivotally fixed to the outer housing 3, latch return springs 35 associated with the L-shaped latch arms 34 to bias the angles 34a of the latch arms 34 against the IC package 24, and latch actuators 38 associated with the L-shaped latch arms 34 to incline them toward the releasing position against the latch return springs 35. With this arrangement, the IC package 24 can be held at its top against the inner housing at the "Burn-In Test Affecting Time" (see FIG. 6), and it can be released subsequent to the termination of the burn-in test as described below in detail.

Figure 16:
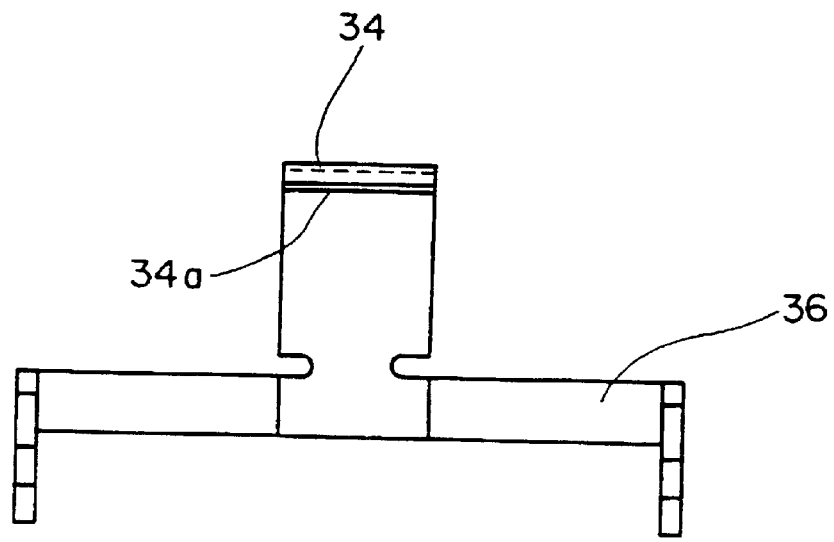
FIG. 16 is a plan view of a pivoting latch piece used with the burn-in socket of FIG. 1.
Figure 17:
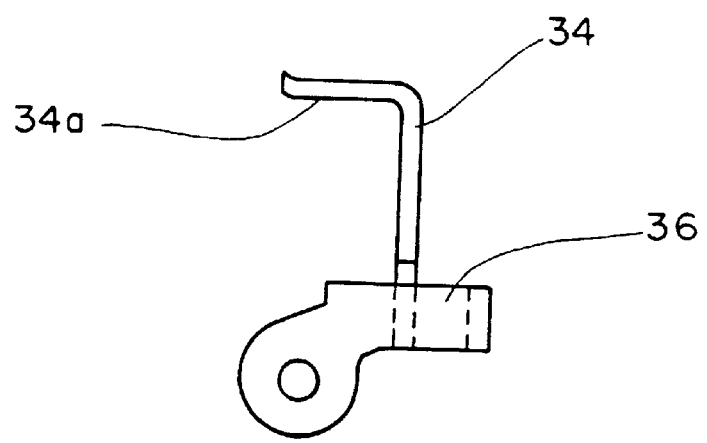
FIG. 17 is a side elevational view of a latch piece of FIG. 16.
Figure 18:
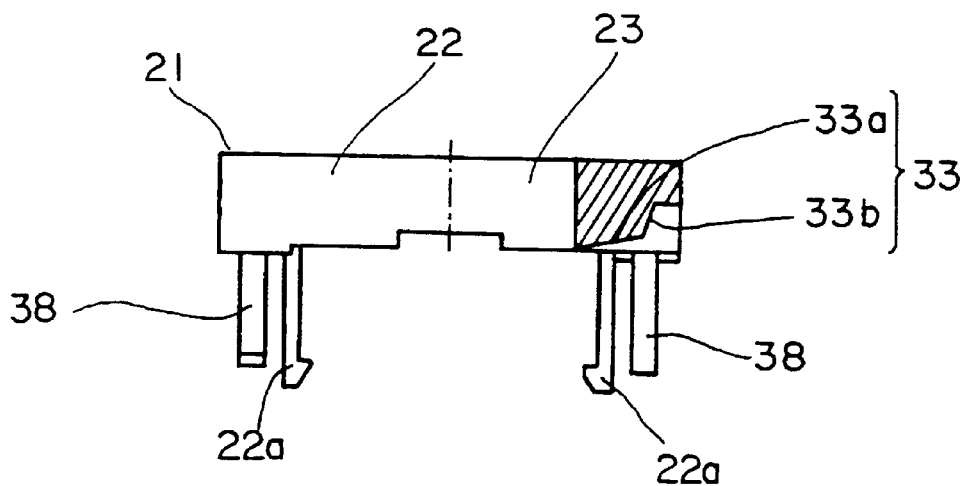
FIG. 18 is a partial sectional side view of a top cover used with the burn-in socket of FIG. 1; and, FIG. 19 is another partial sectional side view of a top cover.
Figure 19:
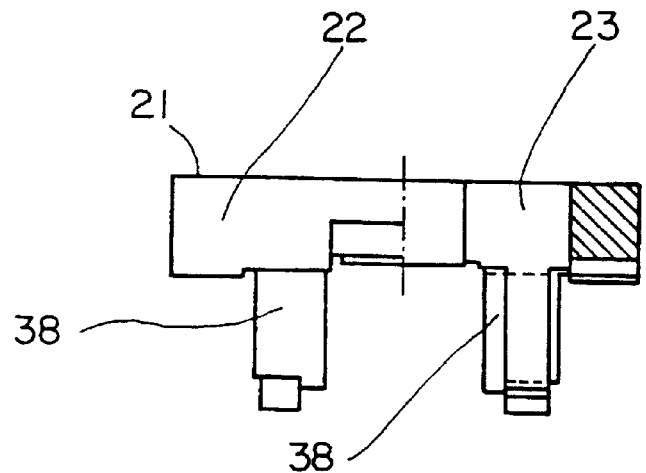

Each L-shaped latch arm 34 (FIGS. 16 and 17) has an inclining piece 36 pivotally fixed to the outer housing 3 at an angular position 90° from each cam 27. This permits each L-shaped latch arm 34 to pivot toward its opposing latch arm 34 for holding the IC package 24 or apart from its opposing latch arm 34 for releasing the IC package 24. Normally, the confronting L-shaped latch arms 34 are held in the latching position under the influence of the latch return springs 35. At the "Burn-In Test Affecting Time" (the top cover 21 being not pushed down) the confronting L-shaped latch arms 34 hold the IC package 24 by pressing their latching surfaces 34a on the top surface of the IC package 24 (see FIGS. 5 and 6). Referring to FIGS. 18 and 19, the top cover 21 has four unlatching rods 38 formed on its bottom to abut on the oppositely inclining pieces 36, thereby serving as latch actuators. The top cover 21 has engagement rods 22a formed on its bottom to catch the socket body 2.

At the "Transition Time" (the top cover 21 in the process of being pushed down), the unlatched rods 38 approach the inclining pieces 36 (see FIGS. 7 and 8), and at "Releasing or Loading Time", prior at which time the top cover 21 is in is lowest position (see FIGS. 9 and 10), the unlatching rods 38 force the L-shaped latch arms 34 to incline away from the top surface of the IC package 24, thereby permitting an automatic loading and removing machine to remove the IC package 24 from the burn-in socket 1 (or to put an IC package 24 into the burn-in socket 1).

The confronting L-shaped latch arms 34 stand upright at the "Transition Time" (FIGS. 7 and 8) to hold the IC package 24 relative to the inner housing 4, thereby preventing the IC package 24 from falling from the inner housing 4 or being displaced laterally thereon. The L-shaped latch arms 34 are opened just prior to "Releasing or Loading Time." For this purpose, the cam surface 32 of each cam 27 is designed to ride the gentle slope portion 33a of the cam follower surface 33 so that the top cover 21 and the inner housing 4 may correspondingly be allowed to descend slowly from the end of the "Burn-In Test Affecting Time" to the end of the "Transition Time", and descend quickly from the end of the "Transition Time" to the "Loading and Releasing Time".

If the IC package 24 falls from the inner housing 4 or is displaced somewhat on the inner housing at the "Transition Time" (see FIGS. 7 and 8), then the burn-in test cannot be effected satisfactorily. To prevent such disadvantage, the L-shaped latch arms 34 stand upright at the "Transition Time" to hold the IC package 24 (see FIG. 8) and are opened just prior to "Releasing or Loading Time" (see FIG. 10). To deter falling or displacement prior to holding, the top cover 21 and the inner housing 4 descends slowly from the "Burn-In Test Effecting Time" to the end of the "Transition Time" by providing that the cam surface 32 of the cam 27 moves along the gentle slope portion 33a of the cam follower surface 33 during this period. Then, after the "Transition Time" until the "Releasing or Loading Time" the top cover 21 and inner housing 4 descend more quickly as the cam surface 32 moves along the steep slope portion 33b of the cam follower surface 33. In this manner, the IC package 24 can be held steadily on the inner housing 4 with the aid of the L-shaped latch arms 34 just prior to the "Releasing or Loading Time" so that burn-in test can be effected satisfactorily. The manner in which a burn-in test is effected with burn-in socket 1 is described below.

Figure 6:
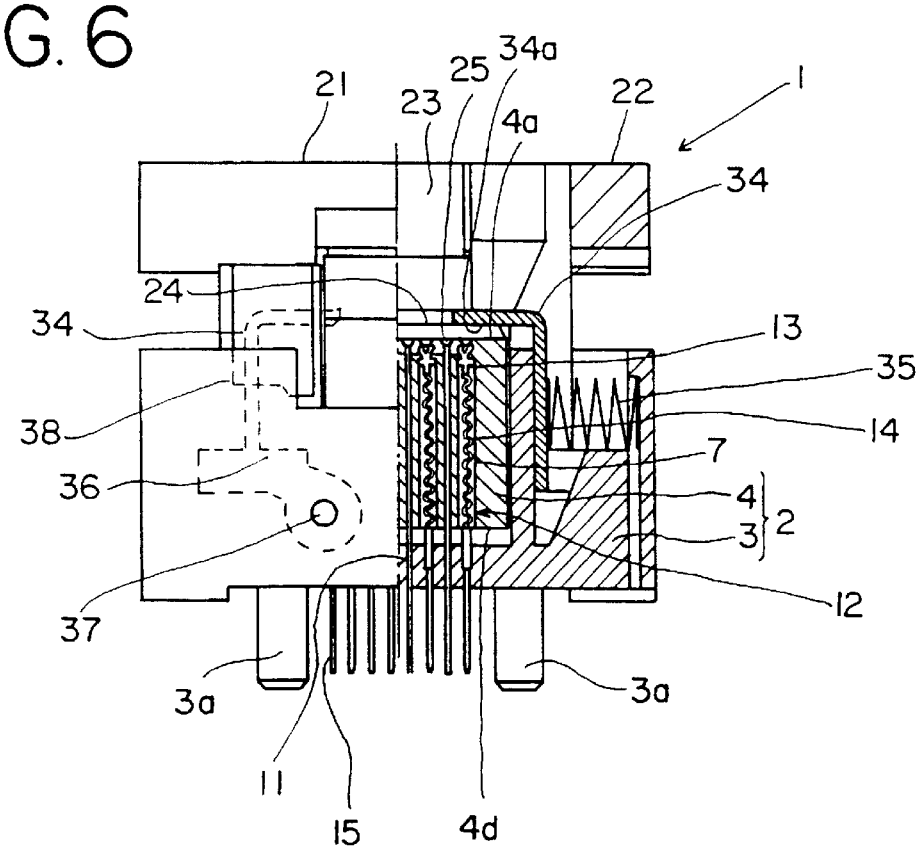
FIG. 6 is a partial sectional view of the burn-in socket of FIG. 1, taken along the line 6—6 in FIG. 1, also showing other components of the socket when an IC package is in place therein.

Referring now to FIGS. 5 and 6, during the burn-in test, no downward force is applied to the top cover 21, thereby allowing the cams 27 to stand upright, with their cam surfaces 32 disposed at their starting positions on the gentle slope portion 33a of the cam follower surfaces 33. The top cover 21 sits at its upper limit position and the opposing projections 30 of the inner housing 4 are loosely fitted in the recesses 31 of the cams 27. The engagement nails 6 of the inner housing 4 are caught by the counter-engagement nails 5 of the outer housing 3. The opposing L-shaped latch arms 34 stand upright to hold the IC package 24 against the inner housing 4 by putting the latching surfaces 34a on the top surface of the IC package 24. In this manner, the solder balls 25 of the IC package 24 are placed in contact with the contact sections 13 of the terminals 12 disposed in the inner housing 4, so that the burn-in test may be affected.

Referring now to FIG. 15, the inner housing 4 is retained at the upper limit position and the IC package 24 is held to the inner housing 4 with the L-shaped latch arms 34. When the solder balls 25 of the IC package 24 contact the contact sections 13 of the terminals 12 of the inner housing 4, the terminals 12 are placed into compression, and the stored compression force results in a convergence of the U-shaped pieces 14b in that the piece-to-piece interval is reduced. Absorbing the compressional force in this manner, however, minimizes lateral bending, and, therefore, a resilient serpentine portion 13 of the terminal 12 is not forced into a wall of the terminal-receiving cavity 7 in which it sits. Rather, the resilient section of each terminal is reduced evenly over its length. This permits each terminal 12 to produce a stable resilient force to be applied to its corresponding solder ball each time a burn-in test is effected, regardless whether the terminal sides is reduced in an attempt to increase terminal density. The resilient serpentine portion 13 of the terminal 12 thus facilitates the design and arrangement of smaller sized terminals at increased densities while assuring that good physical and electrical contact be maintained with the corresponding solder balls.

As mentioned above, every terminal 12 can produce a stable resilient force to be applied to a selected solder ball. More specifically, the solder ball 25 is put in contact with a pair of contact pieces 13b and 13c, which are urged toward the solder ball 25 under the influence of the resilient force stored in the resilient section 14 of the terminal 12. Thus, the confronting paired contact pieces 13b and 13c are positively applied to the solder ball 25, thereby allowing no error into the interface between the confronting paired contact pieces 13b and 13c and the solder ball 25. Elimination of the error deters a significant electrical resistance from appearing at the interface. Even if a selected solder ball were sized within a prescribed allowance, the paired contact pieces defining a V-shaped contact surface would assure that a good electrical contact was made.

As described earlier, the terminal-receiving cavities 7 are arranged to form a unique lattice pattern in which each cavity is arranged in a particular orientation with respect to each adjacent cavity. As shown best in FIGS. 1 and 11, each cavity 7 is illustrated as generally rectangular in configuration and having a pair of first (and long in length) opposing sides 8 that are interconnected by a pair of second (and short in length) opposing sides 9. In the lattice pattern, at least one of the opposing long sides 8 of each cavity is confronted by one short side 9 of each of two adjacent cavities. Similarly, at least one of the opposing short sides 9 of each cavity is confronted by the long sides 8 of adjacent cavities (shown in the drawings as two such adjacent cavities). This arrangement permits an intervening space 10 to occur between the sides of one selected cavity and the confronting sides of each of the surrounding and adjacent cavities.

Each terminal-receiving cavity 7 contains a terminal 12 with its wide or long, side 17 and its narrow or short, side 18 arranged respectively parallel to the long side 8 and short side 9 of its associated cavity 7. The solder balls 25 of the IC package 24 are arranged to correspond to the terminals housed within the cavities in the specified lattice pattern as described. This lattice arrangement permits all of the terminals 12 to be arranged at a substantially equal cavity-to-cavity spacing 10, which permits increasing the density of the terminals 12.

As appreciable from the foregoing description, the inventive socket and method provide significant advantages over conventional burn-in test sockets and methods for conducting burn-in tests of integrated circuits. The unique lattice arrangement of terminal-receiving cavities and terminals therein permits increased terminal density without compromising the strength and physical performance characteristic of the test socket. Furthermore, the interaction of the cam mechanism and latch mechanism relative to the timing of the insertion/removal of the integrated circuit from the socket, and the relative gentle and steep sloped portions of the interaction between the cam surface and cam follower surface provide a reliable socket and method for burn-in testing of integrated circuits, for in the risk of fallen or dislocated integrated circuits is minimized.

The invention is not limited to the embodiment(s) described herein or to any particular embodiment. Specific examples of alternative embodiments considered to be within the scope of the invention, without limitation, include embodiments wherein a common actuation mechanism for the cam mechanism and latch mechanism is dissimilar to a top cover, wherein the cam and latch mechanisms include more or fewer than two rotatable components, wherein the cam or latch return biasing force is accomplished by means other than springs, the non-uniform slope relating to the interaction between the cam surface and the cam follower surface is not limited to a single component, and wherein the portions of perpendicular sides of the terminal-receiving cavities are other than as described or shown herein. Other modifications to the described embodiment(s) may also be made within the scope of the invention. The invention is defined by the following claims.

What is claimed is:

1. A socket for burn-in testing of an integrated circuit ("IC") package, the IC package having a plurality of conductive electrical leads disposed thereon, the socket comprising:
   a socket body that receives at least a portion of the IC package during testing, the socket body including a base member for effecting contact with said IC package leads, the base member having an array of cavities disposed therein;
   a plurality of conductive terminals, a single terminal being disposed in a single cavity, the terminals contacting said leads of said IC package when said IC package is received in said socket;
   each of said cavities having a rectangular configuration with at least four sides arranged in two pairs of opposing first and second sides, said first sides having lengths that are greater than said second sides;
   said rectangular cavities being disposed in said base member in a lattice arrangement, wherein each rectangular cavity is surrounded by at least three adjacent rectangular cavities and such that at least one of said first side of said rectangular cavity is opposed by second sides of said adjacent rectangular cavities.

2. A socket in accordance with claim 1, wherein said leads of said IC package include solder balls disposed thereon and each of said portions of terminals includes a contact section includes contact portions arranged to form a V-shaped contact plane with at least two contact surfaces for engaging a corresponding opposing solder ball when said IC package is placed in said socket.

3. A socket in accordance with claim 1, wherein said rectangular cavities are disposed in said lattice arrangement in discrete columns and rows of rectangular cavities.

4. A socket in accordance with claim 1, wherein said rectangular cavities are disposed in said lattice arrangement such that each rectangular cavity extends perpendicular to adjacent rectangular cavities.

5. A socket in accordance with claim 1, wherein pairs of adjacent rectangular cavities are separated by uniformly-sized intervening spaces.

6. A socket for burn-in testing of an IC package having electrical leads, said socket comprising a socket body having a plurality of terminals fitted in a corresponding plurality of terminal-receiving cavities therein, said terminal-receiving cavities being generally rectangular in shape and arranged to form a lattice pattern in which each cavity is arranged with each of its opposing longer sides facing a shorter side of an adjacent cavity and each of its shorter sides facing a longer side of an adjacent cavity.

7. A socket in accordance with claim 6, wherein a uniformly sized intervening space is present between each side of said generally rectangular terminal-receiving cavity and each of the corresponding confrontingly adjacent cavities.

8. A socket in accordance with claim 6, wherein said leads of said IC package are generally spherical solder balls and each of said plurality of terminals includes a contact section including a pair of contact pieces symmetrically arranged to form a V-shaped contact plane defining oblique contact surfaces for engaging a corresponding solder balls when said integrated circuit package is subjected to a burn-in test.

9. A socket for burn-in testing of an integrated circuit ("IC") package, the IC package having a plurality of conductive electrical leads disposed thereon, the socket comprising:
   a socket body that receives at least a portion of the IC package during testing, the socket body including a base member for effecting contact with said IC package leads, the socket body base member having an array of cavities disposed therein the cavities each having a uniform rectangular configuration, said cavities further being oriented in said socket body base member;
   a plurality of conductive terminals, a single terminal being disposed in a single cavity, the terminals contacting said leads of said IC package when said IC package is received in said socket;
   each of said cavities having at least two pairs of distinct first and second sides, said first sides being longer in length than lengths of said second sides, said cavities being disposed in said base member in an arrangement to increase density of said socket terminals without compromising strength of said socket, the arrangement being wherein each cavity is surrounded by at least three adjacent cavities and each cavity extends perpendicular to adjacent cavities and, at least one of the first sides of each cavity being flanked in opposition by second sides of two of said adjacent cavities.

10. A socket in accordance with claim 9, wherein said leads of said IC package include solder balls disposed thereon and each of said portions of terminals includes a contact section includes contact portions arranged to form a V-shaped contact plane with at least two contact surfaces for engaging a corresponding opposing solder ball when said IC package is placed in said socket.

11. A socket in accordance with claim 9, wherein said cavities are disposed in said lattice arrangement in discrete columns and rows of cavities and wherein said cavities are generally rectangular in configuration.

12. A socket in accordance with claim 9, wherein pairs of adjacent cavities are separated by uniformly-sized intervening spaces.

13. A socket in accordance with claim 12, wherein pairs of adjacent cavities are separated by uniformly-sized intervening spaces.

14. A socket in accordance with claim 1, wherein each of said terminals is rotated 90° relative to terminals in said adjacent cavities.

* * * * *